United States Patent
Morel et al.

(10) Patent No.: US 11,146,186 B2
(45) Date of Patent: Oct. 12, 2021

(54) CIRCUIT AND METHOD FOR ENERGY RECUPERATION

(71) Applicant: Commissariat à l'Energie Atomique et aux Energies Alternatives, Paris (FR)

(72) Inventors: Adrien Morel, Grenoble (FR); Gaël Pillonnet, Proveysieux (FR); Yohan Wanderoild, Meylan (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 391 days.

(21) Appl. No.: 16/230,568

(22) Filed: Dec. 21, 2018

(65) Prior Publication Data

US 2019/0207536 A1 Jul. 4, 2019

(30) Foreign Application Priority Data

Dec. 28, 2017 (FR) ..................... 1763295

(51) Int. Cl.
*H02N 2/18* (2006.01)
*H01L 41/113* (2006.01)
*H02M 3/158* (2006.01)

(52) U.S. Cl.
CPC ............. *H02N 2/181* (2013.01); *H02N 2/188* (2013.01); *H01L 41/1136* (2013.01); *H02M 3/1582* (2013.01)

(58) Field of Classification Search
CPC ...... H02N 2/181; H02N 2/188; H01L 41/113; H01L 41/1136

(Continued)

(56) References Cited

U.S. PATENT DOCUMENTS

2015/0097536 A1* 4/2015 Van Kessel ........... H02M 3/158
                                                         323/271
2019/0165688 A1* 5/2019 Chen ..................... H02M 7/066

FOREIGN PATENT DOCUMENTS

EP    2579445 A1    4/2013
FR    2997247 A1    4/2014
(Continued)

OTHER PUBLICATIONS

Preliminary Search Report in French Application No. 1763295 dated Nov. 8, 2018, 2 pages.

(Continued)

*Primary Examiner* — Derek J Rosenau
(74) *Attorney, Agent, or Firm* — Moreno IP Law LLC (57) ABSTRACT

The invention concerns a circuit for recuperating electrical energy from a mechanical resonator (402) comprising: a voltage inversion circuit (408) configured to invert the voltage across a capacitance (Cp) of the mechanical resonator, the voltage inversion circuit comprising: a capacitor (Cint); and a charge transfer circuit configured: to discharge a voltage of a first polarity held by the capacitance of the mechanical resonator to said capacitor during a first period; and to charge a voltage, of opposite polarity to the first polarity, to the capacitance of the mechanical resonator during a second period using the voltage potential stored by said capacitor during the first period; wherein the charge transfer circuit comprises an inductance and at least one switch controllable to limit the current passing through the inductance.

13 Claims, 6 Drawing Sheets

(58) Field of Classification Search
USPC .......................................................... 310/339
See application file for complete search history.

(56) References Cited

FOREIGN PATENT DOCUMENTS

| WO | 2017179289 A1 | 9/2017 |
|----|---------------|--------|
| WO | 2019121860 A1 | 6/2019 |

OTHER PUBLICATIONS

D. Guyomar et al., "Towards Energy Harvesting Using Active Materials and Conversion Improvement by Nonlinear Processing," IEEE Transactions on Ultrasonics, Ferroelectrics, and Frequency Control, vol. 57, No. 2, Feb. 2010, pp. 584-595.

M. Lallart et al., "Low-Cost Capacitor Voltage Inverter for Outstanding Performance in Piezoelectric Energy Harvesting," IEEE Transactions on Ultrasonics, Ferroelectrics, and Frequency Control, vol. 52, No. 4, Apr. 2005, pp. 281-291.

G.K. Ottman, "Adaptive Piezoelectric Energy Harvesting Circuit for Wireless Remote Power Supply," IEEE Transactions on Power Electronics, vol. 17, No. 5, Sep. 2002, pp. 669-676.

S. Roundy et al., "A piezoelectric vibration based generator for wireless electronics," Smart Mater. Struct. 13 (2004), pp. 1131-1142.

Y.C. Shu et al., "An improved analysis of the SSHI interface in piezoelectric energy harvesting," Smart Mater. Struct. 16 (2007), pp. 2253-2264.

Examination Report for European Application No. 18214947.6, dated Sep. 11, 2019, 4 pages.

Extended European Search Report for European Application No. 18214947.6, dated May 15, 2019, 6 pages.

* cited by examiner

CIRCUIT AND METHOD FOR ENERGY RECUPERATION

FIELD

The present disclosure relates to the field of energy recuperation, and in particular to the recuperation of electrical energy from a mechanical resonator.

BACKGROUND

Materials having piezo-electrical properties permit electrical energy to be recuperated from the oscillations of a mechanical resonator, which is for example excited by a mechanical vibration. Such energy harvesters may be employed in a broad range of environments, and permit for example a battery to be charged from the movement of the resonator.

A difficulty for the implementation of a circuit for energy recuperation from such an alternating electrical signal is to harvest a high amount of energy. Indeed, while a diode bridge can be used to recuperate electrical energy at the positive and negative peaks of the electrical signal, such a solution is relatively inefficient given that the energy is extracted only during a limited portion of each cycle, and thus the power that can be recuperated by such a solution is limited.

While some systems have been proposed providing alternatives to a simple diode bridge that permit the amount of energy that is harvested to be increased, there is a difficulty in reducing energy loss in such systems.

SUMMARY

It is an aim of embodiments of the present description to at least partially address one or more problems in the prior art.

According to one aspect, there is provided a circuit for recuperating electrical energy from a mechanical resonator comprising: a voltage inversion circuit configured to invert the voltage across a capacitance of the mechanical resonator, the voltage inversion circuit comprising: a capacitor; and a charge transfer circuit configured: to discharge a voltage of a first polarity held by the capacitance of the mechanical resonator to said capacitor during a first period; and to charge a voltage, of opposite polarity to the first polarity, to the capacitance of the mechanical resonator during a second period using the voltage potential stored by said capacitor during the first period; the charge transfer circuit comprising an inductance and at least one switch controllable to limit the current passing through the inductance.

According to one embodiment, the inductance of the charge transfer circuit is used in a boost converter configuration during the discharging of the voltage of the first polarity to the capacitance of the mechanical resonator, and in a buck converter configuration during the charging of the voltage of opposite polarity to the capacitance of the mechanical resonator.

According to one embodiment, the circuit further comprises a control circuit configured to control the at least one switch to conduct a current from a first node of the capacitance, through said inductance and back to a second node of the capacitance during a first portion of the first period and to conduct a current from the first node of said capacitance, through said inductance and to said capacitor during a second portion of the first period.

According to one embodiment, the control circuit is configured to control said at least one switch such that there is a plurality of the first and second portions during the first period.

According to one embodiment, the at least one switch is controlled by a clock signal generated by said control circuit.

According to one embodiment, the at least one switch is controlled by the control signal to conduct the current to the capacitor when a measured current in said inductance reaches a threshold limit.

According to one embodiment, the charge transfer circuit comprises an H-bridge and a voltage converter, the H-bridge coupling first and second terminals of the mechanical resonator to first and second inputs of the voltage converter.

According to one embodiment, the voltage converter comprises: the series connection of an inductor and a first switch of the at least one switch coupled between the first input of the voltage converter and a first node of the capacitor; and a second switch of the at least one switch coupled between an intermediate node and the second input of the voltage converter, the intermediate node being between the inductor and the first switch.

According to one embodiment, the charge transfer circuit comprises a transformer having a primary winding coupled between first and second terminals of the mechanical resonator and a secondary winding coupled between first and second nodes of the capacitor.

According to one embodiment, the transformer further comprises a further primary winding coupled to a further mechanical resonator.

According to one embodiment, the charge transfer circuit is further configured: to discharge a voltage of an opposite polarity to the first polarity held by the capacitance of the mechanical resonator to said capacitor during a third period; and to charge a voltage of the first polarity to the capacitance of the mechanical resonator during a fourth period using the voltage potential stored by said capacitor during the third period.

According to a further aspect, there is provided a method of recuperating electrical energy from a mechanical resonator, the method comprising: inverting the voltage across a capacitance of the mechanical resonator by: discharging a voltage of a first polarity held by the capacitance of the mechanical resonator to a capacitor during a first period; and charging a voltage, of opposite polarity to the first polarity, to the capacitance of the mechanical resonator during a second period using the voltage potential stored by said capacitor during the first period; the discharging and/or charging operation comprising controlling a switch to limit the current passing through an inductance.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION OF THE PRESENT EMBODIMENTS

Throughout the present disclosure, the term "connected" is used to designate a direct electrical connection between circuit elements, whereas the term "coupled" is used to designate an electrical connection between circuit elements that may be direct, or may be via one or more further elements such as resistors, diodes, capacitors or transistors. Unless specified otherwise, when elements are described as being coupled, they may also be connected directly. The term "approximately" is used to designate a tolerance of plus or minus 10% of the value in question.

Figure 1:
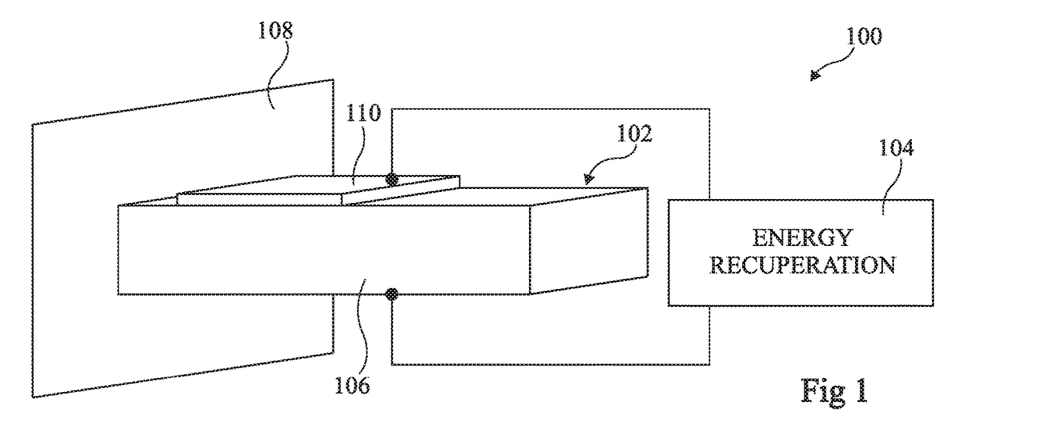
FIG. 1 schematically illustrates an energy harvesting system according to an example embodiment.

FIG. 1 schematically illustrates an energy harvesting system 100 comprising a mechanical resonator 102 and an energy recuperation circuit (ENERGY RECUPERATION) 104.

The mechanical resonator 102 for example comprises a beam 106 adapted to resonate mechanically. In the example of FIG. 1, the beam 106 has one end attached to a support surface 108, although in alternative embodiments other arrangements would be possible. The resonator 102 further comprises a layer 110 of piezoelectric material coupled to the energy recuperation circuit 104. A ground plane of the beam 106 is also for example coupled to the energy recuperation circuit 104.

Figure 2A:
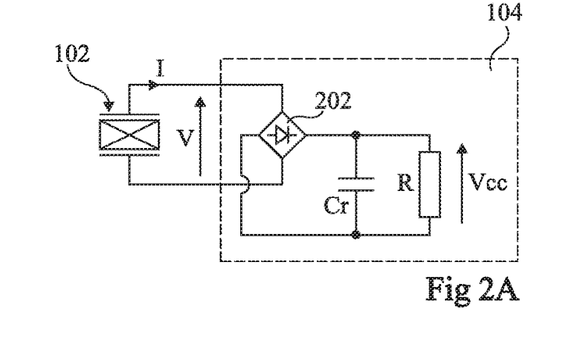
FIG. 2A schematically illustrates a circuit for energy recuperation according to an example embodiment that has been proposed.

FIG. 2A schematically illustrates the mechanical resonator 102 and the energy recuperation circuit 104 according to example embodiment that has been proposed. In the example of FIG. 2A, the energy recuperation circuit 104 comprises a diode bridge 202 coupling the output terminals of the mechanical resonator 102 to the parallel connection of a capacitor Cr and a load R representing the consumption of the harvested energy.

Figure 2B:
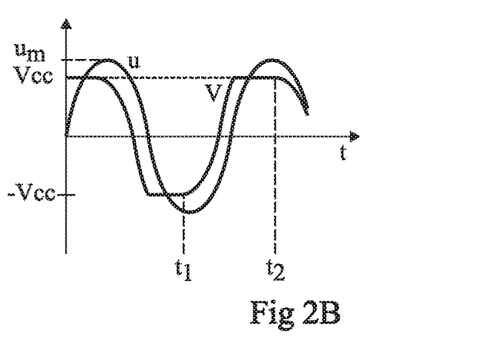
FIG. 2B is a graph representing signals in the circuit of FIG. 2A according to an example embodiment.

FIG. 2B is a graph representing an example of the displacement u of the mechanical resonator 102, and of the voltage Vcc across the capacitor Cr and the load R of FIG. 2A. The diode bridge 202 of FIG. 2A permits energy to be recuperated from the mechanical resonator each time the output voltage exceeds the voltage Vcc.

A drawback of the arrangement of FIG. 2A is that power is only recuperated during the peaks of the each cycle, and therefore the amount of power that can be recuperated is limited.

Figure 3A:
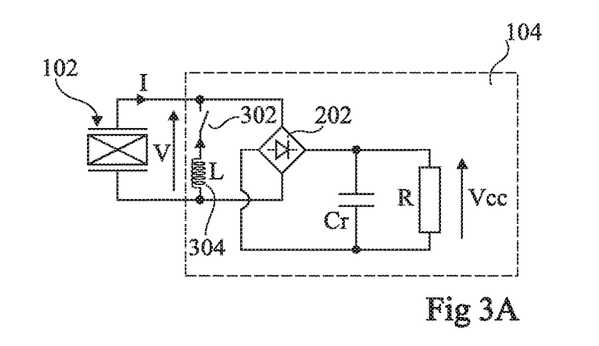
FIG. 3A schematically illustrates a circuit for energy recuperation according to a further example embodiment that has been proposed.

FIG. 3A schematically illustrates the mechanical resonator 102 and energy recuperation circuit 104 of FIG. 1 in more detail according to further example embodiment.

The energy recuperation circuit 104 of FIG. 3A is similar to that of FIG. 2A, except that a voltage inversion circuit formed by the series connection of a switch 302 and an inductor 304 is coupled between the output terminals of a mechanical resonator 102. The switch 302 for example permits a rapid inversion of the voltage across the mechanical resonator 102 as will now be described with reference to FIG. 3B.

Figure 3B:
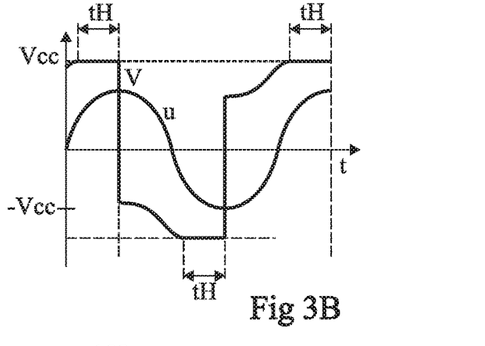
FIG. 3B is a graph representing signals in the circuit of FIG. 3A according to an example embodiment.

FIG. 3B illustrates the mechanical displacement u of the mechanical resonator 102, and the voltage V the across mechanical resonator of FIG. 3A. As illustrated, in the example of FIG. 3B, once the voltage V reaches the level Vcc, energy recuperation can be performed during a period tH, and then the voltage V across the mechanical resonator is inverted by activating the switch 302. Thus the voltage across the resonator 102 rapidly falls to the level close but not equal to −Vcc due to energy loss in the inductor, and a new energy recuperation period tH can commence. The voltage Vcc in FIG. 3B is higher than the voltage Vcc of FIG. 2B.

Figure 3C:
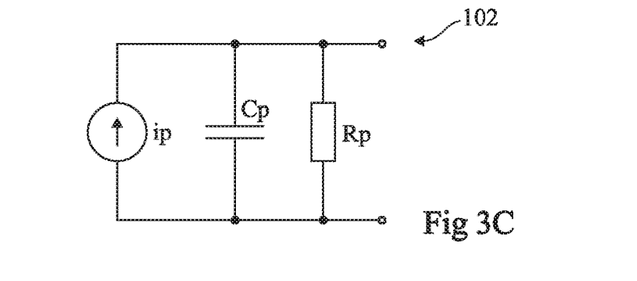
FIG. 3C schematically represents a model of the electrical behavior of a mechanical resonator.

FIG. 3C schematically illustrates an electrical model of the mechanical resonator 102, which can for example be considered to comprise an alternating current source ip, coupled in parallel with a capacitor Cp and a resistor Rp. The resistance Rp represents the dielectric losses of the material, which are generally relatively low and will be considered to be negligible in the following description.

While the arrangement of FIG. 3A permits improved energy recuperation with respect to that of FIG. 2A, it has been found that the amount of extracted energy can be further increased. In particular, the maximum power that can be harvested can be expressed as follows:

$$P_{harvest} = Cp \cdot V_{open}^2 \cdot f \cdot \frac{2}{1 - e^{\frac{\pi}{2Q}}}$$

where $V_{open}$ represents the open circuit voltage amplitude of the piezo-electric material, f represents the frequency of oscillation of the mechanical resonator, and Q represents the quality factor of the charge inversion mechanism, which is for example directly related to the inductor that is used. For example, the quality factor Q can be expressed as: $1/R_1 \sqrt{L/Cp}$ where $R_1$ is the series resistance of the inductor and L is the inductance of the inductor.

Thus it can be seen that the higher the Q factor, the lower the energy loss and the higher the harvested energy.

Figure 4:
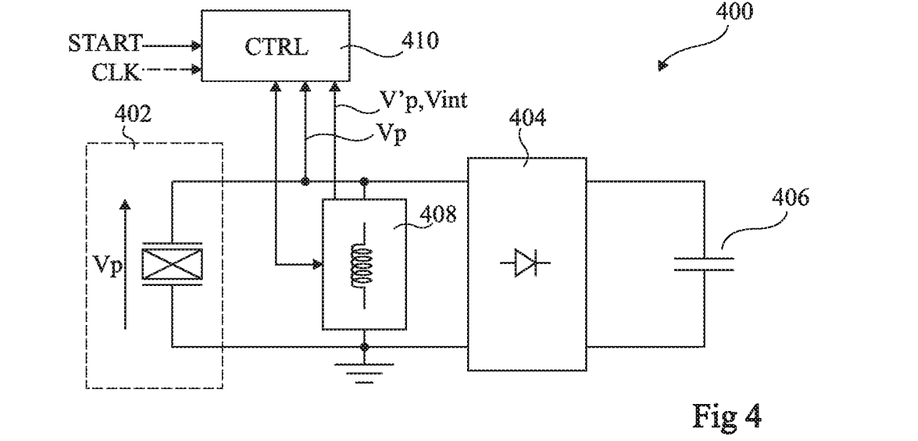
FIG. 4 schematically illustrates an energy harvesting system according to an embodiment of the present disclosure.

FIG. 4 schematically illustrates an energy harvesting system 400 according to example embodiment of the present disclosure. For example, the energy harvesting system 400 forms part of a medical device such as a pace maker, or may be used to recuperate energy from the vibrations of industrial machines, vehicle engines, sports shoes, etc.

The system 400 for example comprises a mechanical resonator 402, which is for example similar to the mechanical resonator 100 of FIG. 1. The resonator 402 is coupled to an energy recuperation circuit 404, which for example extracts electrical energy from the mechanical resonator and stores it to a capacitor 406. Furthermore, the harvesting system 400 for example comprises a voltage inversion circuit 408, which performs the role of inverting the voltage across the mechanical resonator 402 at precise moments during each cycle in order to amplify the resonance of the system.

The circuit 408 is for example controlled by a control circuit (CTRL) 410, which for example receives as inputs the voltage Vp across the mechanical resonator 402, and further voltages V'p and Vint described in more detail below. The circuit 410 may also receive a clock signal CLK. The circuit 410 for example generates control signals for controlling switches of the circuit 408, as will be described in more detail below.

Figure 5:
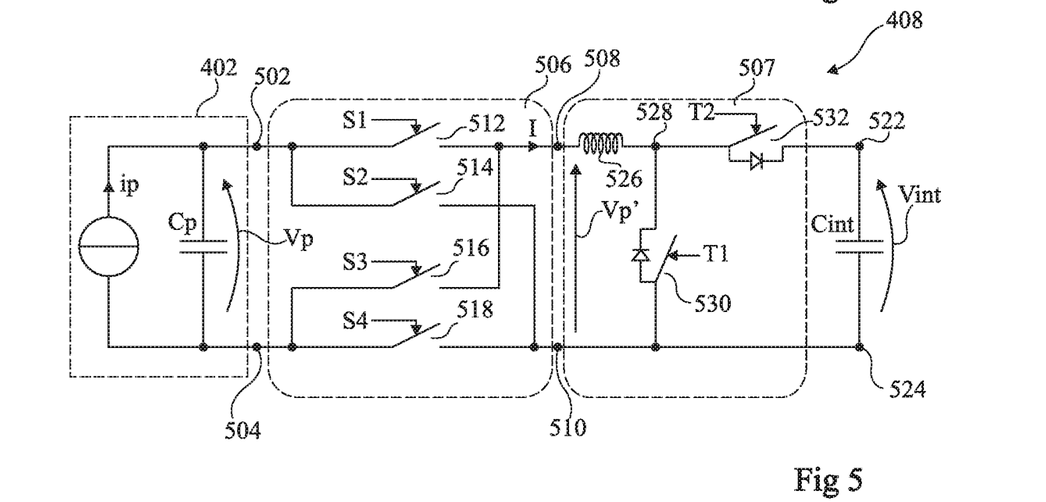
FIG. 5 schematically illustrates a voltage inversion circuit of the system of FIG. 4 in more detail according to an example embodiment.

FIG. 5 schematically illustrates the mechanical resonator 402 and the voltage inversion circuit 408 of FIG. 4 in more detail according to an example embodiment.

The mechanical resonator 402 is for example modelled in the example of FIG. 5 by a current source conducting an alternating current ip, and a capacitor Cp coupled in parallel between output terminals 502 and 504 of the mechanical resonator 402.

The voltage inversion circuit 408 for example comprises an H-bridge 506 and a voltage converter 507.

The H-bridge 506 for example has output nodes 508 and 510, and comprises four switches, a switch 512 coupling the input node 502 to the output node 508, a switch 514 coupling the input node 502 to the output node 510, a switch 516 coupling the input node 504 to the output node 508, and a switch 518 coupling the input node 504 to the output node 510. The switches 512 to 518 are respectively controlled by control signals S1 to S4 generated by the control circuit 410 of FIG. 4.

The output nodes 508 and 510 of the H-bridge 506 are coupled to the voltage converter 507, which has output nodes 522 and 524 coupled to respective terminals of a capacitor Cint. The capacitor Cint for example has a capacitance significantly smaller than the capacitance Cp, for example equal to 50% or less of the capacitance Cp.

The voltage converter 507 for example comprises an inductor 526 coupled between the node 508 and an intermediate node 528. The node 528 is in turn coupled to the node 510 via a switch 530 and to the output node 522 of the voltage converter 507 via a switch 532. The switch 530 is controlled by a signal T1, and the switch 532 is controlled by a signal T2.

In operation, the voltage inversion circuit 408 is configured to invert the voltage across the capacitance Cp of the mechanical resonator 402. For this, the H-bridge 506 and voltage converter 507 form a charge transfer circuit, which is configured to discharge a voltage of a first polarity held by the capacitance Cp to the capacitor Cint during a first period, and to charge a voltage, of opposite polarity to the first polarity, to the capacitance Cp during a second period using the voltage potential stored by the capacitor Cint. As will be explained in more detail below, the discharging and/or charging operations involve passing a current through an inductance, such as through the inductor 526, in a switched manner such that the current is limited. An advantage of limiting the current in this manner is that the energy losses in the inductor will be reduced.

Operation of the circuit of FIG. 5 will now be described in more detail with reference to FIGS. 6, 7 and 8A to 8D.

Figure 6:
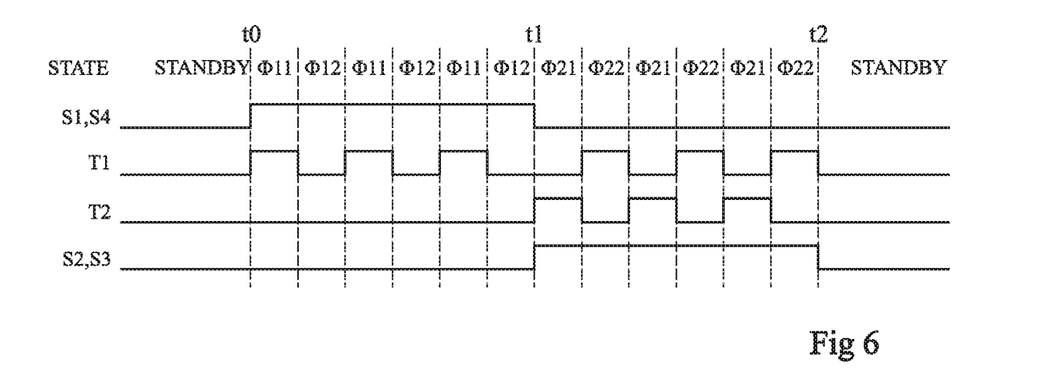
FIG. 6 is a timing diagram representing an example of signals in the circuit of FIG. 5 during one type of voltage inversion according to an embodiment of the present disclosure.

FIG. 6 is a timing diagram representing, for states of the voltage inversion circuit 408, an example of the timing of the control signals S1, S2, S3, S4, T1 and T3.

Figure 7:
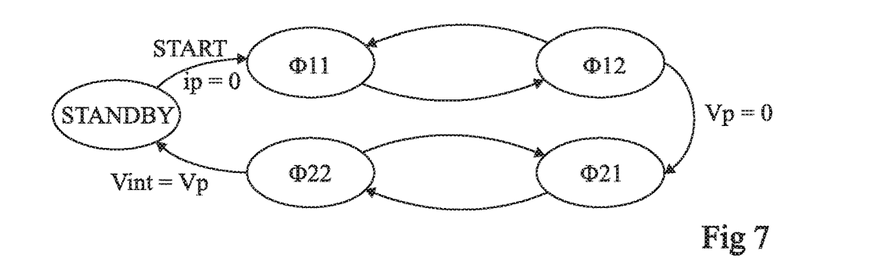
FIG. 7 is a state diagram representing the operation of the circuit of FIG. 5 during one type of voltage inversion according to an example embodiment.

FIG. 7 is a state diagram representing the operation of the circuit of FIG. 5.

FIGS. 8A to 8D schematically illustrate the circuit of FIG. 5 during various operating phases.

As illustrated in FIGS. 6 and 7, the circuit 408 is for example initially in a standby state (STANDBY) in which the signals S1 to S4 and T1 and T2 are all for example low. A signal START provided to the control circuit 410 of FIG. 4 for example indicates when energy harvesting is to begin, which is for example when the current ip=0, in other words when |Vp| starts to decrease, and thus $\partial |Vp|/\partial t < 0$.

Figure 8A:
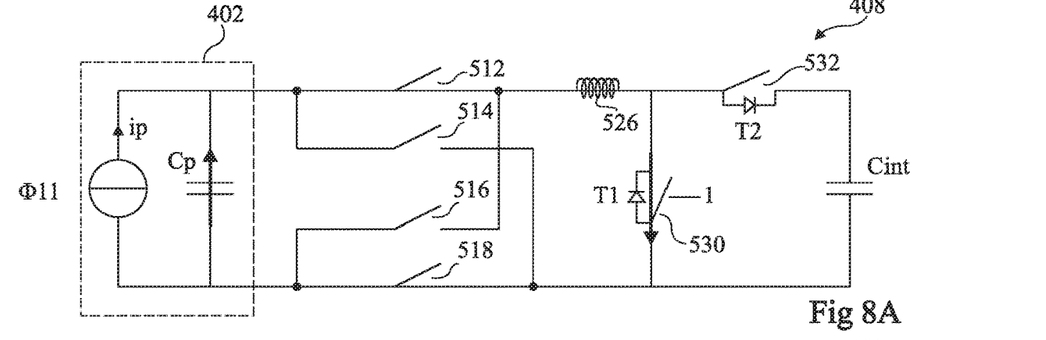
FIGS. 8A to 8D schematically illustrate the circuit of FIG. 5 during various operating states according to an example embodiment.

In the example of FIG. 6, energy harvesting begins at a time t0. The example of FIG. 6 assumes the case in which Vp>0. The circuit then enters a state $\phi 11$ in which the signals S1, S4 and T1 are for example asserted, while the other control signals remain low. As illustrated in FIG. 8A, this for example causes a current to flow from the capacitance Cp of the mechanical resonator 402, through the switch 512 of the H-bridge 506, through the inductor 526 and the switch 530 of the voltage converter 507, thereby bypassing the capacitor Cint, and then back through the switch 518 of the H-bridge 506.

Figure 8B:
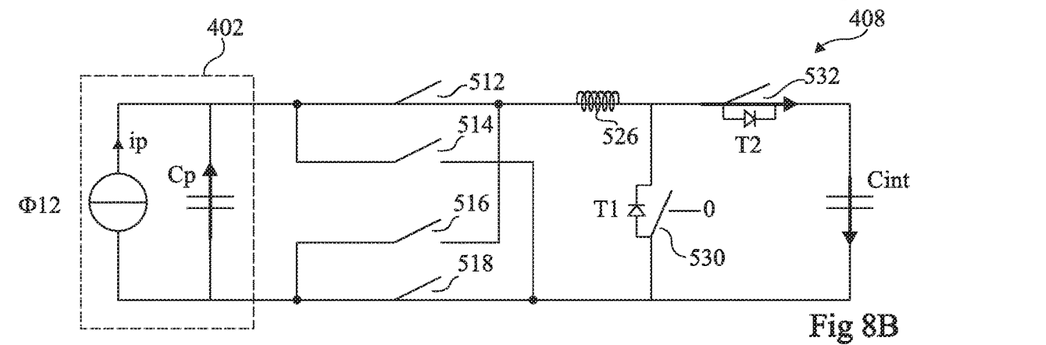

After a certain time period, for example determined by the clock signal CLK or by a measured current level through the inductor, the state $\phi 12$ is for example entered, in which the signal T1 is brought low to block the current flow through the switch 530. For example, the transition from the state $\phi 11$ to the state $\phi 12$ is implemented by the control circuit 410 when it detects that the current level through the inductor 526 has reached an upper limit I_high measured by the control circuit 410. As represented in FIG. 8B, the inductor 526 causes a continuation of current flow, which then passes through a diode parallel to the switch 532, and charges the capacitor Cint. This diode is for example the intrinsic diode of a MOS transistor in the case that the switch 532 is implemented by one or more MOS devices. Alternatively, a diode may be coupled in parallel with the switch 532.

After a certain time period, for example determined by the clock signal CLK or by a measured current level through the inductor, the circuit returns to the state $\phi 11$. For example, the transition from the state $\phi 12$ to the state $\phi 11$ is implemented by the control circuit 410 when it detects that the current level through the inductor 526 has fallen to a lower limit I_low.

The circuit 408 then for example continues to alternate between the states $\phi 11$ and $\phi 12$, during which the capacitance of the mechanical resonator 402 is discharged, until the voltage Vp across the terminals of the mechanical resonator 402 has fallen to 0 V or to another low level. In the example of FIG. 6, this occurs at a time t1.

Figure 8C:
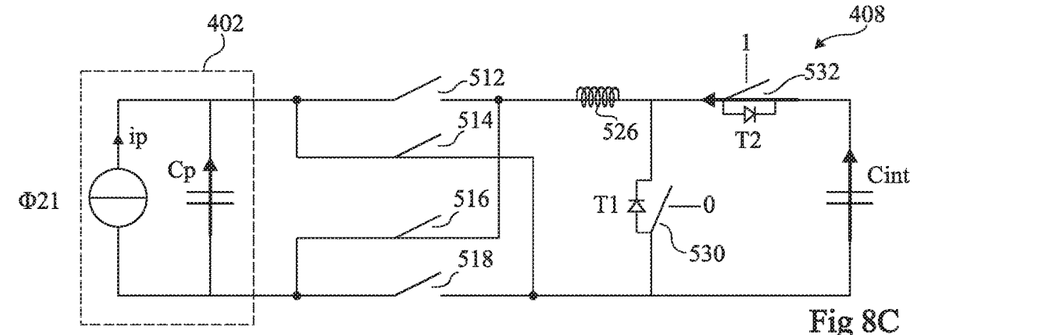

The circuit 408 then enters a state φ21 in which the signals S1 and S4 are brought low, and the signals T2, S2 and S3 are asserted. Thus, as represented in FIG. 8C, the capacitor Cp is charged by a current flowing from the capacitor Cint, through the switch 532 and the inductor 526 of the voltage converter 507, through the switch 516 of the H-bridge to the terminal 504 of the mechanical resonator 402, and then back through the switch 514 of the H-bridge to the capacitor Cint.

Figure 8D:
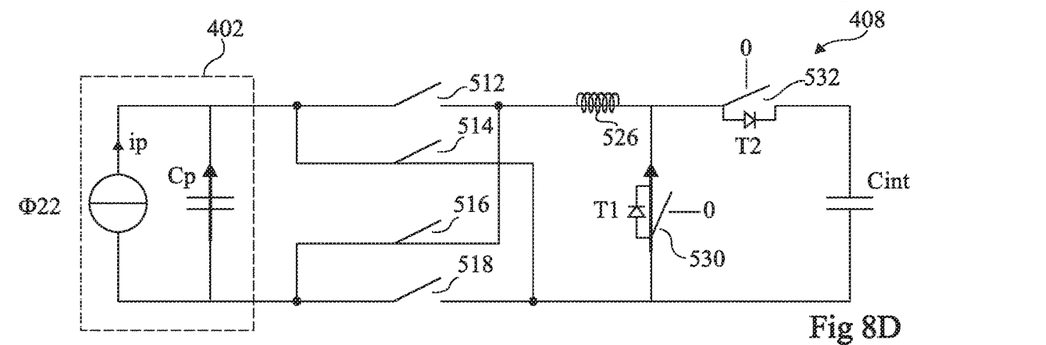

After a certain time period, for example determined by the clock signal CLK or by a measured current level through the inductor, the state φ22 is for example entered, in which the signal T2 is brought low to block the current flow through the switch 532. For example, the transition from the state φ21 to the state φ22 is implemented by the control circuit 410 when it detects that the current level through the inductor 526 has reached an upper limit I_high. As represented in FIG. 8D, the inductor 526 causes a continuation of current flow, which then passes through a diode parallel to the switch 530 and continues to charge the capacitance Cp. This diode is for example the intrinsic diode of a MOS transistor in the case that the switch 530 is implemented by one or more MOS devices. Alternatively, a diode may be coupled in parallel with the switch 530.

After a certain time period, for example determined by the clock signal CLK or by a measured current level through the inductor, the circuit returns to the state φ21. For example, the transition from the state φ22 to the state φ21 is implemented by the control circuit 410 when it detects that the current level through the inductor 526 has fallen to the lower limit I_low.

The circuit 408 then for example continues to alternate between the states φ21 and φ22, during which the capacitance of the mechanical resonator 402 is charged, until the voltage Vint across the capacitor Cint has fallen to V'p. In the example of FIG. 6, this occurs at a time t2.

The H-bridge 506 is for example controlled such that V'p is always positive. Thus, in the case of an inversion from a negative level of Vp to a positive level of Vp, during the states φ11 and φ12, the signals S2 and S3 are for example asserted, and during the states φ21 and φ22 the signals S1 and S4 are for example asserted.

Figure 9:
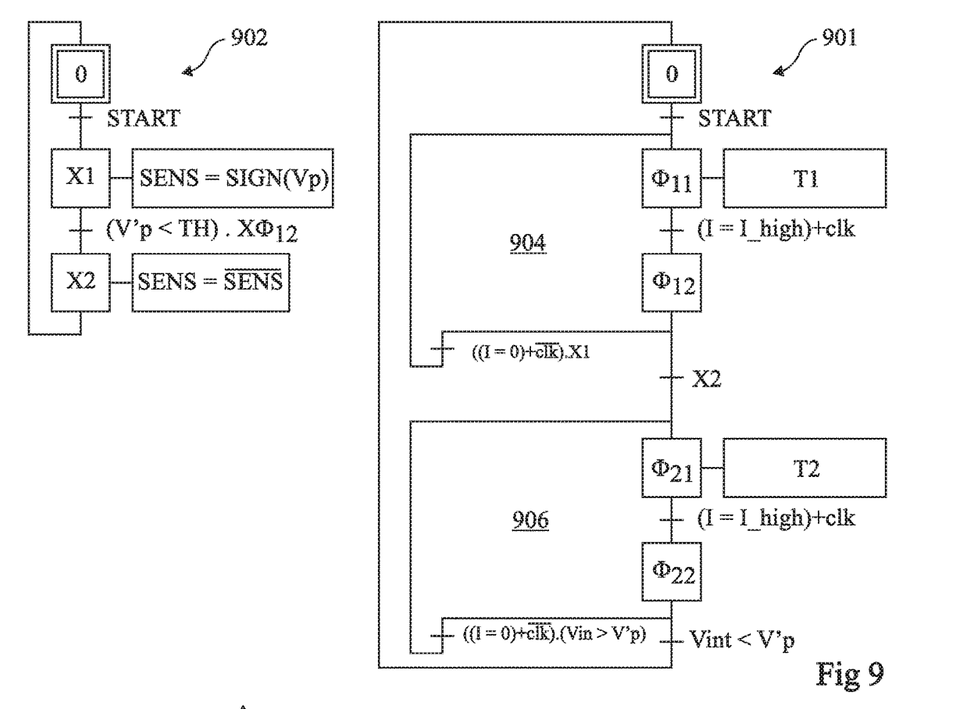
FIG. 9 is a flow diagram representing the operation of the circuit of FIG. 5 in more detail according to an example embodiment.

FIG. 9 is a flow diagram representing the state transitions of the circuit 408 of FIG. 4 in more detail according to an example embodiment. The operations represented by this flow diagram are for example implemented by the control circuit 410 of FIG. 4.

Two parallel flows 901 and 902 are represented in FIG. 9. The flow 901 comprises a loop 904 implementing the transitions between the states φ11 and φ12, and a loop 906 implementing the transitions between the states φ21 and φ22. The flow 902 controls the transition between the loops 904 and 906 and the value of a parameter SENS.

The standby state is represented by boxes with states "0" and "10" in the flows 901 and 902 of FIG. 9. Once the start condition (START) is met, the flow 901 enters the state φ11 as described above in which the signal T1 is asserted, and the flow 902 enters a state "X1" in which the sign of the voltage Vp across the capacitance Cp is for example monitored. A parameter SENS is for example set equal to the sign of the voltage Vp across the capacitance Cp of the mechanical resonator. The parameter SENS is used to control the operation of the H-bridge 506 to ensure that the voltage Vp' is always positive, as described above.

While in the state "X1", the flow 901 remains in the loop 904. In particular, from the state φ11, when the current I through the inductor 526 reaches the higher limit I_high, or a clock signal CLK is asserted, the state φ12 is entered. From the state φ12, when the current falls to 0 or to a lower limit I_low, or when the clock signal CLK falls low, the state φ11 is returned to.

In the flow 902, when it is determined that the voltage V'p has fallen below a threshold TH and the flow 901 is in the state φ12, a state "X2" is entered, and the parameter SENS is inverted. The flow 901 thus transitions to the loop 906, and to the stage φ21, in which the signal T2 is asserted. While in the state "X2", the flow 901 remains in the loop 906. In particular, from the state φ21, when the current I through the inductor 526 reaches the upper limit I_high, or a clock signal CLK is asserted, the state φ22 is entered. From the state φ22, if the voltage Vint across the capacitor Cint has fallen below the voltage V'p, the loop 906 is exited, and the standby states "0" and "10" are returned to. Alternatively, when the current falls to 0 or to a lower limit I_low, or when the clock signal CLK falls low, the state φ21 is returned to.

Figure 10:
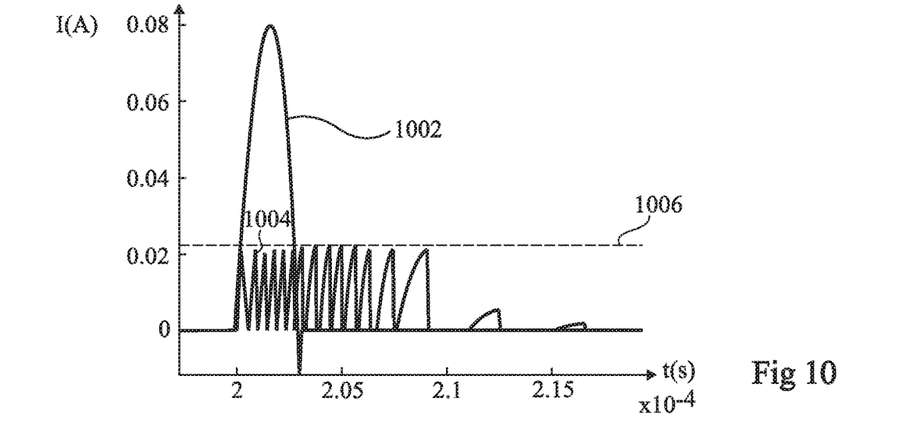
FIG. 10 is a graph representing a comparison of current flow in a standard voltage inversion circuit and in the circuit of FIG. 5.

FIG. 10 is a graph representing a comparison of current flow in a standard voltage inversion circuit, such as through the inductor 304 of FIG. 3A, and the current flow through the inductor 526 in the circuit of FIG. 5.

A curve 1002 represents the current in the circuit 104 of FIG. 3A during a discharge of the capacitance Cp of the mechanical resonator, and it can be seen that in the example of FIG. 10 this current rises to a peak of around 80 mA.

A curve 1004 represents the current in the circuit of FIG. 5, in which the current limit I_high is for example set at 20 mA, and it can be seen that in this case the current for example remains below a level 1006 only slightly higher than this current limit.

While in the example of FIG. 10 the current falls to zero between each charge transfer, in alternative embodiments the current limit I_low could be regulated to always remain between two positive current levels, such that the average current remains at a desired relatively low level, and the charge transfer can be performed relatively quickly.

Figure 11A:
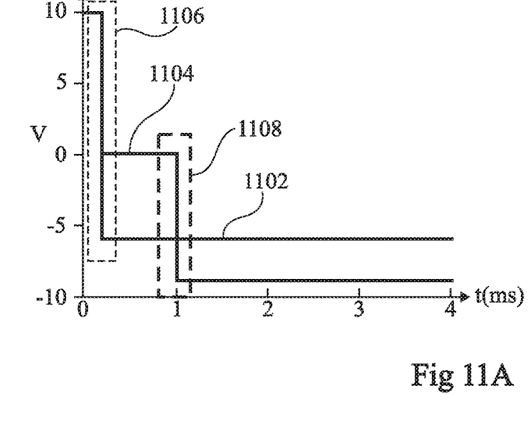
FIG. 11A is a graph representing a comparison of the voltage across a mechanical resonator in the circuit of FIG. 3A and in the circuit of FIG. 5.

FIG. 11A is a graph representing a comparison of the voltage across a piezoelectric material based on a standard energy recuperation circuit such as that of FIG. 3A and on the circuit of FIG. 5.

A curve 1102 represents the case for the circuit of FIG. 3A, and it can be seen that the voltage is inverted rapidly from around 10 V to around −6 V.

A curve 1104 represents the case for the circuit of FIG. 5, in which a period 1106 corresponds to the switching between the states φ11 and φ12, and a period 1108 corresponds to the switching between the states φ21 and φ22. While a relatively long time interval between the periods 1106 and 1108 is shown in FIG. 11A, in practice these periods can be separated by less than a millisecond. It can be seen that the voltage falls from the initial level of around 10 V to a level of around −9 V, which is considerably lower than the curve 1102 due to the reduced energy loss in the circuit of FIG. 5.

Figure 11B:
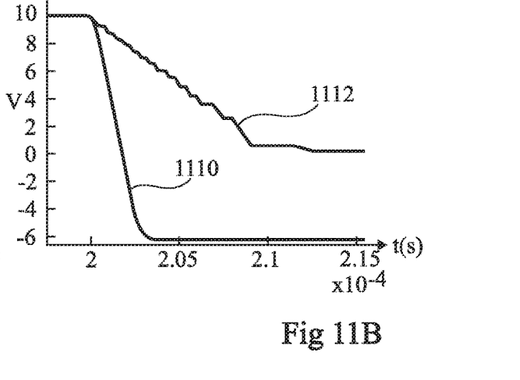
FIG. 11B is a graph representing a period of FIG. 11A in more detail according to example embodiment.

FIG. 11B is a graph representing the period 1106 of FIG. 11A in more detail. A curve 1110 represents the case for the circuit of FIG. 3A. A curve 1112 represents the case for the circuit of FIG. 5, and it can be seen than transition occurs over many discrete steps in which small amounts of energy are transferred.

While in the example of FIG. 4 the energy is harvested directly by the energy recuperation circuit 404 from the voltage Vp at the output of the mechanical resonator, in alternative embodiments the energy can additionally or alternatively be harvested from the capacitor Cint of the voltage inversion circuit 408, as will now be described in more detail with reference to FIG. 12.

Figure 12:
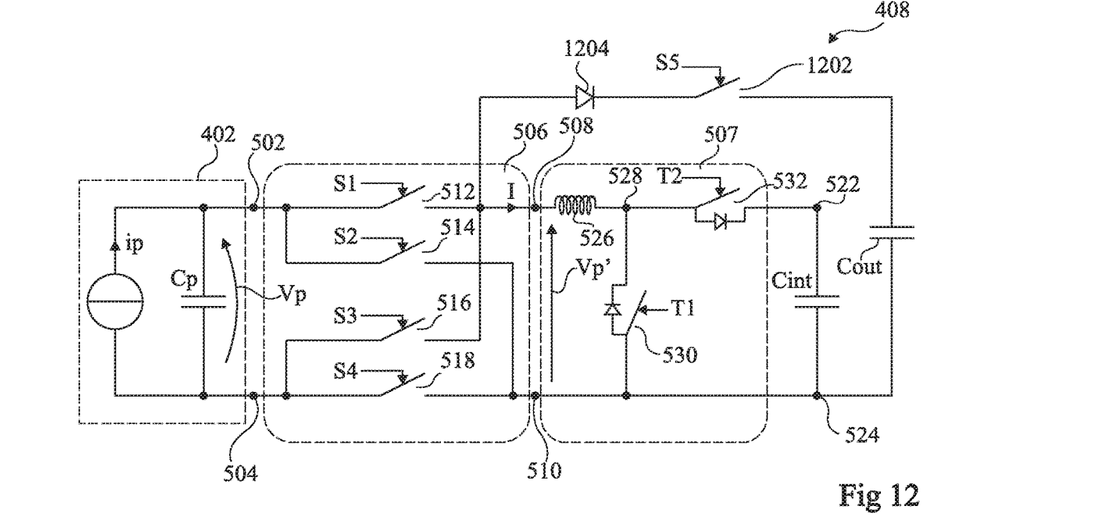
FIG. 12 schematically illustrates a voltage inversion circuit of the system of FIG. 4 in more detail according to a further example embodiment.

FIG. 12 schematically illustrates the voltage inversion circuit 408 of the system of FIG. 4 in more detail according to an alternative to that of FIG. 5.

With respect to the circuit of FIG. 5, the circuit of FIG. 12 comprises an energy recuperation circuit comprising a switch 1202 and capacitor Cout coupled in series between the input 508 of the voltage converter 507 and the output 524 of the voltage converter. In some embodiments, a diode 1204 is also coupled between the node 508 and the switch 1202, the anode of the diode 1204 being coupled to the node 508. The switch 1202 is for example controlled by a control signal S5 in order to extract energy from the capacitor Cint during peaks of the voltage Vp', as will be apparent to those skilled in the art. In some cases, the diode 1204 can be omitted if the timing of the switch 1202 can be controlled in a relatively precise manner. The inductor 526 between the capacitors Cint and Cout for example allows a reduction in energy loss when the voltages across the capacitors are not equal.

While in the example of FIG. 5 the current is limited by a switching operation during both the discharging and recharging of the capacitance Cp, in alternative embodiments a gain can be obtained by limiting the current in this way only during one of the discharging and charging operations, as will now be described with reference to FIG. 13.

Figure 13:
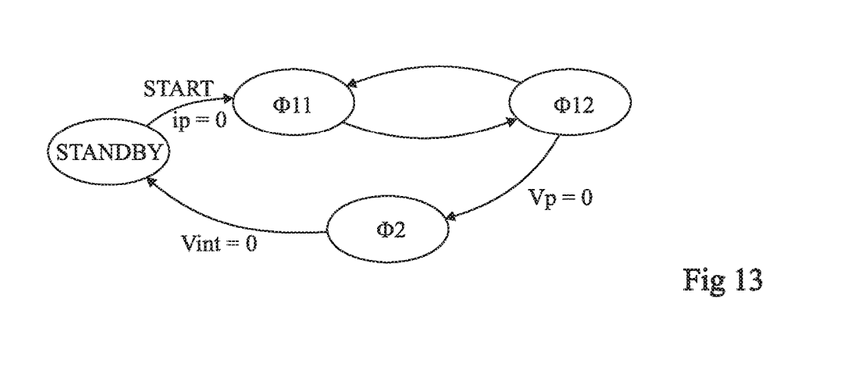
FIG. 13 is a state diagram representing operating states of a voltage inversion circuit during one type of voltage inversion according to a further example embodiment.

FIG. 13 is a state diagram representing operating states of a voltage inversion circuit according to a further example embodiment similar to that of FIG. 7. As illustrated, the states φ21 and φ22 are replaced by a single state φ2 in which the capacitance Cp is charged during a continuous operation, until the voltage Vint has fallen to 0 V. In the case of FIG. 13, the capacitance of Cint is for example approximately equal to that of the capacitance Cp.

Figures 14, 15:
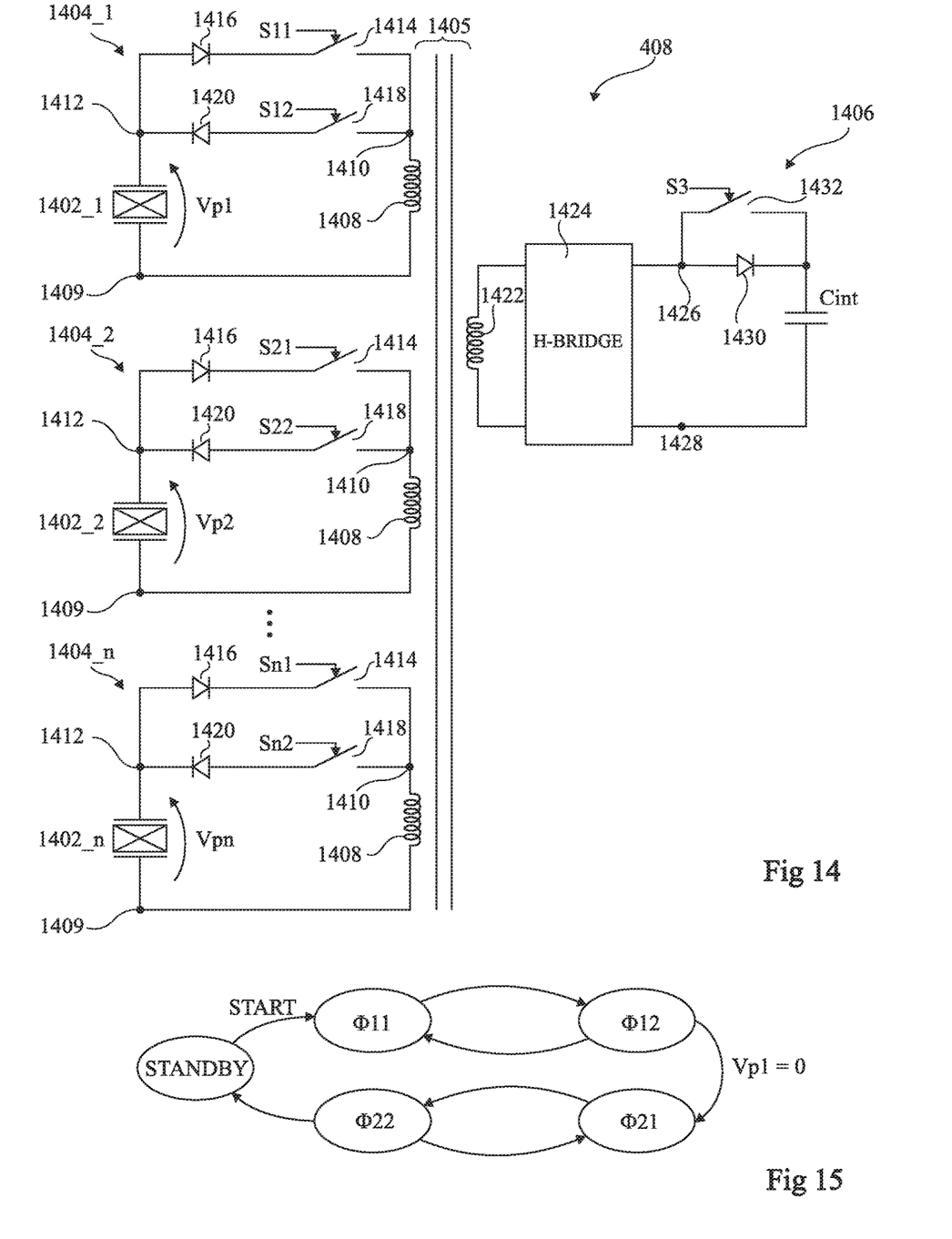
FIG. 14 schematically illustrates a voltage inversion circuit according to yet a further example embodiment of the present disclosure.
FIG. 15 is a state diagram representing operating states of the voltage inversion circuit of FIG. 14.

FIG. 14 schematically illustrates the voltage inversion circuit 408 of FIG. 4 in more detail according to yet a further alternative embodiment to that of FIG. 5.

In the example of FIG. 14 there is a plurality of mechanical resonators 1402_1 to 1402_n. Each mechanical resonator 1402_1 to 1402_n is coupled to a corresponding inductive circuit 1404_1 to 1404_n, and these circuits are coupled by a transformer 1405 to a common inductive circuit 1406 comprising the capacitor Cint.

The inductive element of each of the circuits 1404_1 to 1404_n is for example a corresponding primary winding 1408 of the transformer 1405. The primary winding 1408 of each circuit is coupled between nodes 1409 and 1410, the node 1409 being coupled to one terminal of the corresponding mechanical resonator. The other terminal of each mechanical resonator is coupled to a node 1412. The nodes 1410 and 1412 of each circuit are coupled together by the series connection of a switch 1414 and a diode 1416 having its anode coupled to the node 1412, and by the series connection of a switch 1418 and a diode 1420 having its anode coupled to the switch 1418. The switches 1414 and 1418 of the circuit 1404_1 are controlled by control signals S11 and S12 respectively, the switches 1414 and 1418 of the circuit 1404_2 are controlled by control signals S21 and S22 respectively and the switches 1414 and 1418 of the circuit 1404_n are controlled by control signals Sn1 and Sn2 respectively.

The transformer 1405 for example comprises a single secondary winding 1422, which is for example coupled, via an H-bridge (H-BRIDGE) 1424, to nodes 1426 and 1428. The nodes 1426 and 1428 are for example coupled together via the series connection of a diode 1430 and the capacitor Cint, the diode 1430 for example having its anode coupled to the node 1426. A switch 1432 controlled by a control signal S3 is for example coupled in parallel with the diode 1430 between the node 1426 and the capacitor Cint.

In operation, the inversion of the voltage across the terminals of the resonators 1402_1 to 1402_n may be performed in parallel, or in sequence. An example of the inversion of the voltage across the resonator 1402_1 will now be described with reference to FIG. 15.

FIG. 15 is a state diagram representing operating states of the circuits 1404_1 and 1406 of the voltage inversion circuit of FIG. 14.

During the standby state (STANDBY) the control signals S11, S12 and S3 are for example low. The transition (START) to the state φ11 for example occurs when the current ip1 generated within the mechanical resonator 1402_1 is equal to zero.

In the case that VP1>0 (SENS=1), in the state φ11 the signal S11 is for example asserted, and the signals S21 . . . Sn1 may also be asserted in the case that the resonators 1402_2 to 1402_n are inverted in parallel with the resonator 1402_1. The transition to the state φ12 for example occurs when the current in the winding 1408 reaches a limit I_high, and in the state φ12, the signal S11 is brought low (and also the signals S21 . . . Sn1 if asserted). The transition back to the state φ11 occurs when the current falls to a limit I_low, and a transition from the state φ12 to the state φ21 for example occurs when the voltage Vp1 across the resonator 1401_n is at or close to zero. In the state φ21, the signal S3 is asserted. A transition to the state φ22 for example occurs when the current reaches the limit I_high, and in the state φ22, the signal S3 is for example brought low, the signal S12 is for example asserted, and the signals S12 . . . Sn2 may also be asserted in the case that the resonators 1402_1 to 1402_n are inverted in parallel.

In the case that VP1<0 (SENS=0), in the state φ11 the signal S12 is for example asserted, and the signals S22 . . . Sn2 may also be asserted in the case that the resonators 1402_2 to 1402_n are inverted in parallel with the resonator 1402_1. The transition to the state φ12 for example occurs when the current in the winding 1408 reaches a limit I_high, and in the state φ12, the signal S12 is brought low (and also the signals S22 . . . Sn2 if asserted). The transition back to the state φ11 occurs when the current falls to a limit I_low, and a transition from the state φ12 to the state φ21 for example occurs when the voltage Vp1 across the resonator 1401_n is at or close to zero. In the state φ21, the signal S3 is asserted. A transition to the state φ22 for example occurs when the current reaches the limit I_high, and in the state φ22, the signal S3 is for example brought low, the signal S11 is for example asserted, and the signals S21 . . . Sn1 may also be asserted in the case that the resonators 1402_1 to 1402_n are inverted in parallel.

An advantage of the embodiments described herein is that energy loss can be reduced by limiting the current in an inductor of a voltage inversion circuit. This for example permits an improvement in the energy efficiency of an energy harvesting system, and/or a reduction in the Q factor of the inductor, allowing for example the cost and/or the size of the inductor to be reduced.

Having thus described at least one illustrative embodiment, various alterations, modifications and improvements will readily occur to those skilled in the art. For example, it will be apparent to those skilled in the art that while switches have been described in relation with the various embodiments that are activated by high voltage levels, some or all of the switches could instead be activated by low voltage levels. Furthermore, the various features described in relation with the various embodiments could be combined, in alternative embodiments, in any combination.

What is claimed is:

1. A circuit for recuperating electrical energy from a mechanical resonator comprising:
a control circuit; and
a voltage inversion circuit configured to invert the voltage across a capacitance of the mechanical resonator, the voltage inversion circuit comprising:
a capacitor; and
a charge transfer circuit configured:
to discharge a voltage of a first polarity held by the capacitance of the mechanical resonator to said capacitor during a first period; and
to charge a voltage, of opposite polarity to the first polarity, to the capacitance of the mechanical resonator during a second period using the voltage potential stored by said capacitor during the first period;
wherein the charge transfer circuit comprises an inductance and at least one switch, the control circuit being configured to switch the at least one switch during the first and/or second period to limit the current passing through the inductance.

2. The circuit of claim 1, wherein the inductance of the charge transfer circuit is used in a boost converter configuration during the discharging of the voltage of the first polarity to the capacitance of the mechanical resonator, and in a buck converter configuration during the charging of the voltage of opposite polarity to the capacitance of the mechanical resonator.

3. The circuit of claim 2, wherein the control circuit is configured to control said at least one switch to conduct a current from a first node of said capacitance, through said inductance and back to a second node of said capacitance during a first portion of the first period and to conduct a current from the first node of said capacitance, through said inductance and to said capacitor during a second portion of the first period.

4. The circuit of claim 3, wherein the control circuit is configured to control said at least one switch such that there is a plurality of said first and second portions during the first period.

5. The circuit of claim 3, wherein said at least one switch is controlled by a clock signal generated by said control circuit.

6. The circuit of claim 3, wherein said at least one switch is controlled by said control signal to conduct the current to said capacitor when a measured current in said inductance reaches a threshold limit.

7. The circuit of claim 3, wherein said charge transfer circuit comprises an H-bridge and a voltage converter, the H-bridge coupling first and second terminals of the mechanical resonator to first and second inputs of the voltage converter.

8. The circuit of claim 7, wherein said voltage converter comprises:
the series connection of an inductor and a first switch of said at least one switch coupled between said first input of the voltage converter and a first node of said capacitor; and
a second switch of said at least one switch coupled between an intermediate node and the second input of the voltage converter, the intermediate node being between the inductor and the first switch.

9. The circuit of claim 3, wherein said charge transfer circuit comprises a transformer having a primary winding coupled between first and second terminals of the mechanical resonator and a secondary winding coupled between first and second nodes of said capacitor.

10. The circuit of claim 9, wherein the transformer further comprises a further primary winding coupled to a further mechanical resonator.

11. The circuit of claim 1, wherein the charge transfer circuit is further configured:
to discharge a voltage of an opposite polarity to the first polarity held by the capacitance of the mechanical resonator to said capacitor during a third period; and
to charge a voltage of the first polarity to the capacitance of the mechanical resonator during a fourth period using the voltage potential stored by said capacitor during the third period.

12. A method of recuperating electrical energy from a mechanical resonator, the method comprising:
inverting the voltage across a capacitance of the mechanical resonator by:
discharging a voltage of a first polarity held by the capacitance of the mechanical resonator to a capacitor during a first period; and
charging a voltage, of opposite polarity to the first polarity, to the capacitance of the mechanical resonator during a second period using the voltage potential stored by said capacitor during the first period;
wherein said discharging and/or charging operation comprises switching, by a control circuit, at least one switch during the first and/or second period to limit the current passing through an inductance.

13. A circuit for recuperating electrical energy from a mechanical resonator comprising:
a control circuit; and
a voltage inversion circuit configured to invert the voltage across a capacitance of the mechanical resonator, the voltage inversion circuit comprising:
a capacitor; and
a charge transfer circuit configured:
to discharge a voltage of a first polarity held by the capacitance of the mechanical resonator to said capacitor during a first period; and
to charge a voltage, of opposite polarity to the first polarity, to the capacitance of the mechanical resonator during a second period using the voltage potential stored by said capacitor during the first period;
wherein the charge transfer circuit comprises an inductance and at least one switch, the control circuit being configured to switch the at least one switch during the first and/or second period to limit the current passing through the inductance,
and wherein the control circuit is configured to control said at least one switch to conduct a current from a first node of said capacitance, through said inductance and back to a second node of said capacitance during a first portion of the first period and to conduct a current from the first node of said capacitance, through said inductance and to said capacitor during a second portion of the first period.

* * * * *